US012628654B2

(12) United States Patent
Yu et al.

(10) Patent No.: US 12,628,654 B2
(45) Date of Patent: May 12, 2026

(54) CHIP PACKAGE WITH ELECTROMAGNETIC INTERFERENCE SHIELDING LAYER AND METHOD OF MANUFACTURING THE SAME

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 410 days.

(21) Appl. No.: 18/243,672

(22) Filed: Sep. 8, 2023

(65) Prior Publication Data

US 2024/0145404 A1    May 2, 2024

(30) Foreign Application Priority Data

Oct. 26, 2022    (TW) .................................. 111140642

(51) Int. Cl.
*H10W 42/20*        (2026.01)
*H10W 70/05*        (2026.01)
(Continued)

(52) U.S. Cl.
CPC ........... *H10W 42/20* (2026.01); *H10W 74/01* (2026.01); *H10W 70/05* (2026.01); *H10W 70/60* (2026.01);
(Continued)

(58) Field of Classification Search
CPC ... H01L 24/94; H01L 21/561; H01L 2224/94; H01L 21/56; H01L 23/3171; H01L 23/552; H01L 2224/05655; H01L 2224/13021; H01L 2224/05548; H01L 2224/05008; H10W 70/60; H10W 70/05; H10W 72/9223; H10W 72/942; H10W 42/263;
(Continued)

(56) References Cited

U.S. PATENT DOCUMENTS

| | | | | |
|---|---|---|---|---|
| 7,977,783 | B1 * | 7/2011 | Park ..................... | H10W 72/012 |
| | | | | 257/E29.325 |
| 7,994,045 | B1 * | 8/2011 | Huemoeller ............ | H01L 24/05 |
| | | | | 438/612 |

(Continued)

*Primary Examiner* — Didarul A Mazumder
(74) *Attorney, Agent, or Firm* — Fei-hung Yang

(57)        ABSTRACT

A chip package with electromagnetic interference (EMI) shielding layer and a method of manufacturing the same are provided. The chip package includes a chip, a redistribution layer (RDL), an insulating layer, and an electromagnetic interference (EMI) shielding layer. A peripheral wall is formed around at least one first opening of the insulating layer for enclosing the first opening and a flat portion is disposed around the peripheral wall while a level of the flat portion is lower than a level of the peripheral wall. The flat portion of the insulating layer is covered with the EMI shielding layer which is isolated and electrically insulated from a pad in the first opening by the peripheral wall of the insulating layer. Thereby problems of the chip including fast increase in temperature and electromagnetic interference can be solved effectively.

12 Claims, 7 Drawing Sheets

(51) Int. Cl.

| | |
|---|---|
| *H10W 70/60* | (2026.01) |
| *H10W 72/00* | (2026.01) |
| *H10W 72/20* | (2026.01) |
| *H10W 72/90* | (2026.01) |
| *H10W 74/01* | (2026.01) |

(52) U.S. Cl.
CPC .. *H10W 72/01951* (2026.01); *H10W 72/0198*
(2026.01); *H10W 72/242* (2026.01); *H10W 72/922* (2026.01); *H10W 72/9223* (2026.01); *H10W 72/923* (2026.01); *H10W 72/942* (2026.01); *H10W 72/952* (2026.01)

(58) Field of Classification Search
CPC . H10W 42/20; H10W 72/019; H10W 72/922; H10W 72/923
USPC ........................................................ 257/659
See application file for complete search history.

(56) References Cited

U.S. PATENT DOCUMENTS

| | | | |
|---|---|---|---|
| 2017/0236802 A1* | 8/2017 | Hsieh | H01L 21/76879 |
| | | | 257/737 |
| 2019/0123016 A1* | 4/2019 | Lin | H01L 24/11 |
| 2020/0144321 A1* | 5/2020 | Yeh | H10F 39/804 |
| 2021/0183760 A1* | 6/2021 | Shih | H01L 23/293 |
| 2021/0343656 A1* | 11/2021 | Kwon | H01L 24/13 |
| 2024/0105659 A1* | 3/2024 | Mao | H01L 24/05 |

* cited by examiner

CHIP PACKAGE WITH ELECTROMAGNETIC INTERFERENCE SHIELDING LAYER AND METHOD OF MANUFACTURING THE SAME

CROSS-REFERENCE TO RELATED APPLICATIONS

This non-provisional application claims priority under 35 U.S.C. § 119(a) on Patent Application No(s). 111140642 filed in Taiwan, R.O.C. on Oct. 26, 2022, the entire contents of which are hereby incorporated by reference.

BACKGROUND OF THE INVENTION

The present invention relates to a chip package and a method of manufacturing the same, especially to a chip package with electromagnetic interference (EMI) shielding layer and a method of manufacturing the same.

As the use time increases, temperature of chips in electronic products is getting higher. This leads to short circuit, failure, or even damages of the electronics and thus product reliability is further reduced. Moreover, chips in electronic products are susceptible to electromagnetic Interference and thus product reliability is lowered.

SUMMARY OF THE INVENTION

Therefore, it is a primary object of the present invention to provide a chip package with electromagnetic interference (EMI) shielding layer, which includes a chip, a redistribution layer (RDL), an insulating layer, and an electromagnetic interference (EMI) shielding layer. A peripheral wall is formed around at least one first opening of the insulating layer for enclosing the first opening and a flat portion is disposed around the peripheral wall while a level of the flat portion is lower than a level of the peripheral wall. The flat portion of the insulating layer is covered with the EMI shielding layer for preventing the chip from electromagnetic interference. The EMI shielding layer is isolated and electrically insulated from the pad in the first opening by the peripheral wall of the insulating layer. Thereby problems of the chip including easy increase in temperature and electromagnetic interference can be solved effectively.

In order to achieve the above object, a chip package with electromagnetic interference (EMI) shielding layer according to the present invention includes a chip, a redistribution layer (RDL), an insulating layer, and an electromagnetic interference (EMI) shielding layer. The chip is provided with a surface on which at least one die pad and at least one chip protective layer are disposed. The chip is formed by cutting a wafer. The RDL is arranged at a surface of the chip protective layer of the chip and provided with at least one conductive circuit which is electrically connected with the die pad of the chip. The conductive circuit is provided with at least one pad which is exposed on a surface of the RDL for electrically connected with the outside. The surface of the RDL is covered with the insulating layer completely and the insulating layer is provided with at least one first opening for allowing the pad of the conductive circuit to be exposed by the first opening. A peripheral wall is formed around the first opening of the insulating layer for enclosing the first opening and a flat portion is disposed around the peripheral wall while a level of the flat portion is lower than a level of the peripheral wall. The EMI shielding layer is made of metal and covering the flat portion of the insulating layer for preventing the conductive circuit and the chip from electromagnetic interference. The EMI shielding layer is isolated and electrically insulated from the pad by the peripheral wall of the insulating layer.

Preferably, the RDL further includes at least one first dielectric layer and at least one second dielectric layer. The first dielectric layer is covering a surface of the chip protective layer of the chip and provided with at least one first groove for allowing the die pad to be exposed by the first groove. The second dielectric layer is covering a surface of the first dielectric layer and provided with at least one second groove which is communicating with the first groove of the first dielectric layer. The conductive circuit is further formed by a metal paste being filled into the first groove and the second groove smoothly and fully. Thereby the die pad is electrically connected with the conductive circuit.

It is another object of the present invention to provide a method of manufacturing a chip package with electromagnetic interference (EMI) shielding layer having the following steps. Step S1: providing a wafer on which a plurality of chips is disposed to form an array and each of the chips includes a surface on which at least one die pad and at least one chip protective layer are disposed. A cut groove is formed between the two adjacent chips of the wafer for separating the chips. Step S2: covering a surface of the chip protective layer of the chip with at least one redistribution layer (RDL) and the RDL having at least one conductive circuit which is electrically connected with the die pad of the chip while the conductive circuit is provided with at least one pad which is exposed on a surface of the RDL for electrically connected with the outside. Step S3: covering a surface of the RDL with an insulating layer completely and the insulating layer is provided with at least one first opening for allowing the pad of the conductive circuit to be exposed by the first opening. Step S4: forming a peripheral wall around the first opening of the insulating layer for enclosing the first opening and forming a flat portion around the peripheral wall of the insulating layer while a level of the flat portion is lower than a level of the peripheral wall. Step S5: covering the flat portion of the insulating layer with an electromagnetic interference (EMI) shielding layer and the EMI shielding layer is made of metal. The EMI shielding layer is isolated and electrically insulated from the pad by the peripheral wall of the insulating layer. Step S6: cutting along the cut grooves of the wafer for separating the chips on the wafer to form a plurality of chip packages.

DETAILED DESCRIPTION OF THE PROFFERED EMBODIMENT

Figure 3:
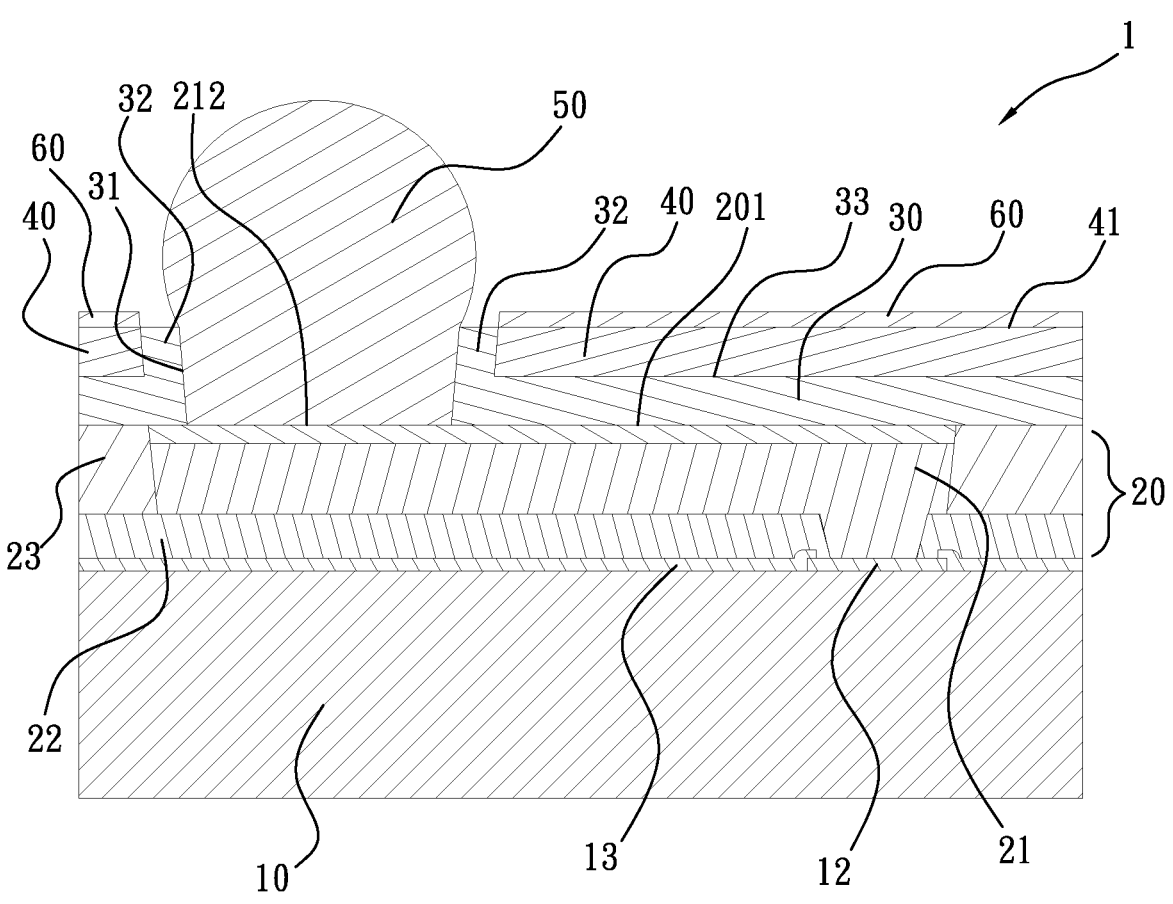
FIG. 3 is a sectional view of an embodiment of a chip package according to the present invention.

Refer to FIG. 3, a chip package 1 with electromagnetic interference (EMI) shielding layer according to the present invention includes a chip 10, a redistribution layer (RDL) 20, an insulating layer 30, and an electromagnetic interference (EMI) shielding layer 40.

Figure 1:
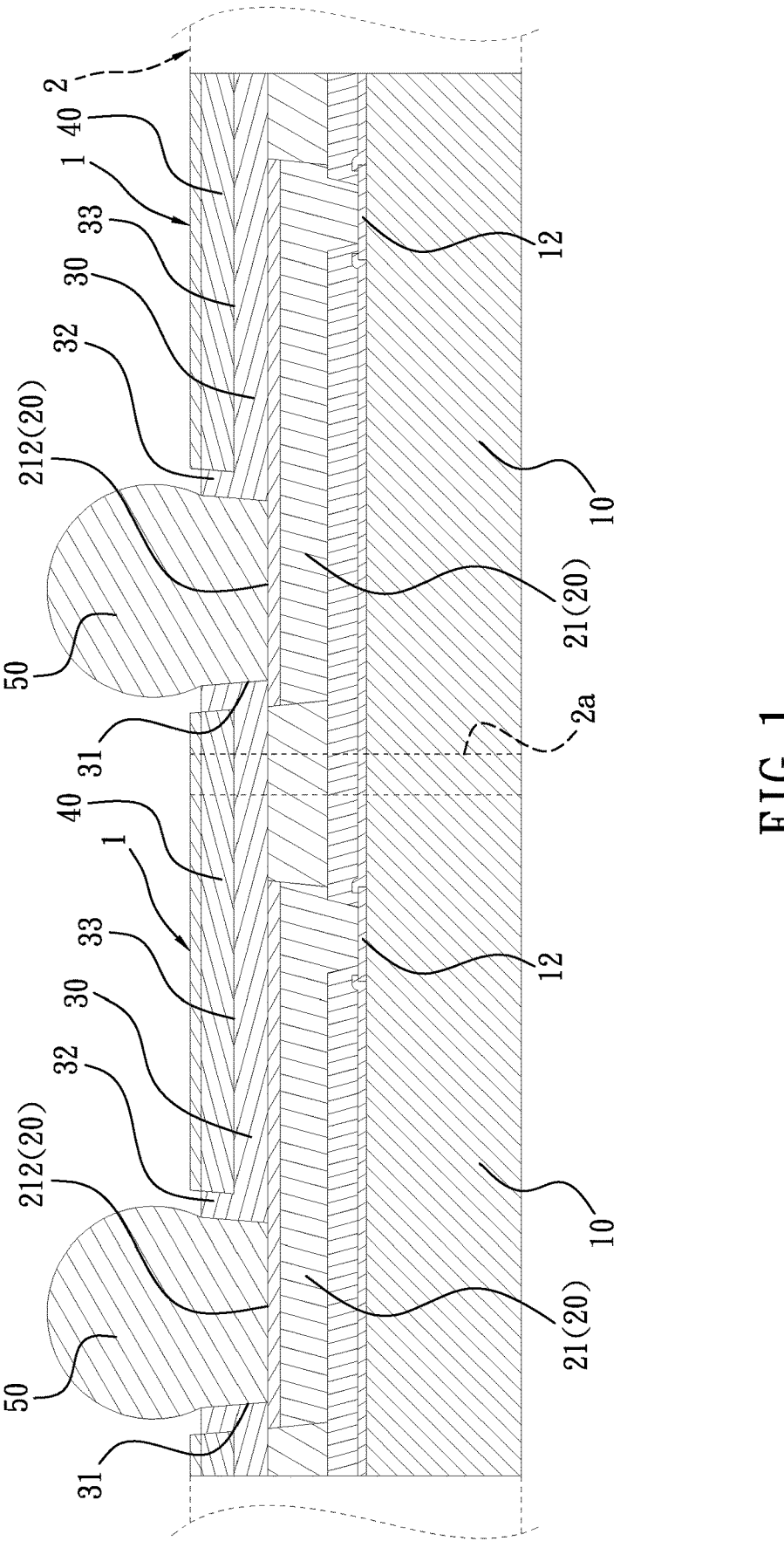
FIG. 1 is a side view of a section of a wafer with a plurality of chips according to the present invention.

The chip 10 includes a surface 11 on which at least one die pad 12 and at least one chip protective layer 13 are disposed. The chip 10 is formed by cutting a wafer 2, as shown in FIG. 1.

Figure 8:
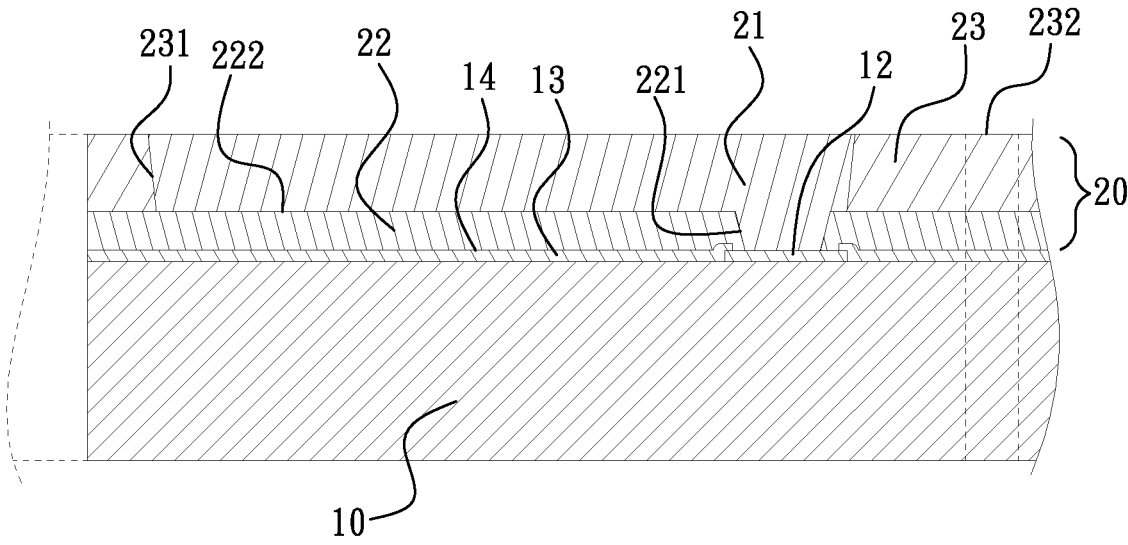
FIG. 8 is a schematic drawing showing conductive circuit formed in the first groove and the second groove in FIG. 7 according to the present invention.
Figure 10:
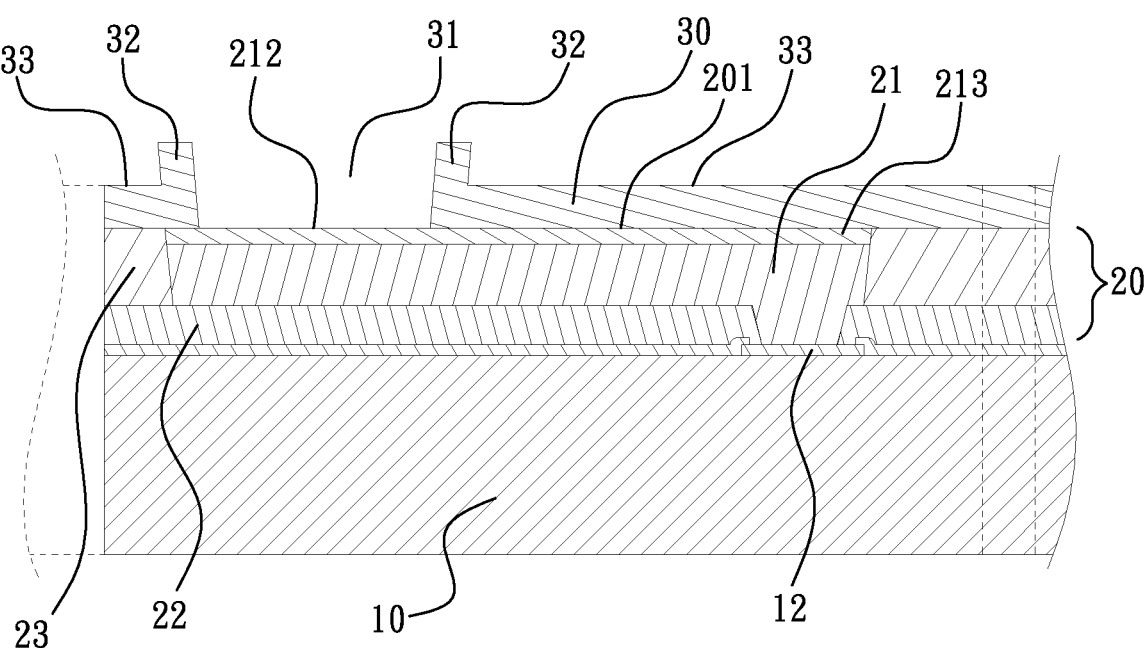
FIG. 10 is a schematic drawing showing an insulating layer disposed on a redistribution layer in FIG. 9 according to the present invention.

The RDL 20 is arranged at a surface 14 of the chip protective layer 13 of the chip 10 and provided with at least one conductive circuit 21 which is electrically connected with the die pad 12 of the chip 10, as shown in FIG. 8. The conductive circuit 21 is provided with at least one pad 212 which is exposed on a surface 201 of the RDL 20 for electrically connected with the outside, as shown in FIG. 10. The conductive circuit 21 is made of silver (Ag) adhesive, but not limited.

As shown in FIG. 10, the insulating layer 30 is covering and disposed on the surface 201 of the RDL 20 completely and provided with at least one first opening 31 for allowing the pad 212 of the conductive circuit 21 to be exposed. A peripheral wall 32 is formed around the first opening 31 of the insulating layer 30 for enclosing the first opening 31 and a flat portion 33 is disposed around the peripheral wall 32 while a level of the flat portion 33 is lower than a level of the peripheral wall 32.

Figure 12:
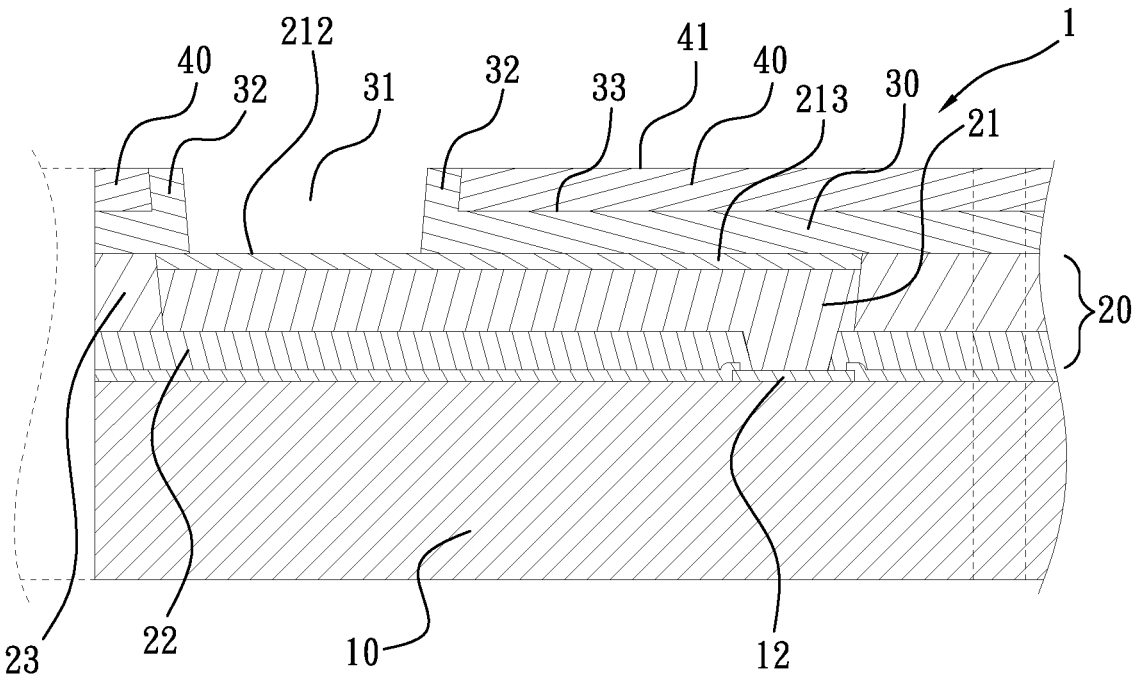
FIG. 12 is a schematic drawing showing an electromagnetic interference (EMI) shielding layer formed on the flat portion of the insulating layer in FIG. 11 according to the present invention.

The EMI shielding layer 40 is made of metal such as silver (Ag) adhesive and used to cover the flat portion 33 of the insulating layer 30 for preventing the conductive circuit 21 and the chip 10 from electromagnetic interference, as shown in FIG. 12. A level of the EMI shielding layer 40 is not higher than the level of the peripheral wall 32 of the insulating layer 30. That means the EMI shielding layer 40 is isolated by the peripheral wall 32 and located outside the peripheral wall 32. Thereby the EMI shielding layer 40 is set apart and electrically insulated from the pad 212, without having interference or influence on the pad 212.

Figure 2:
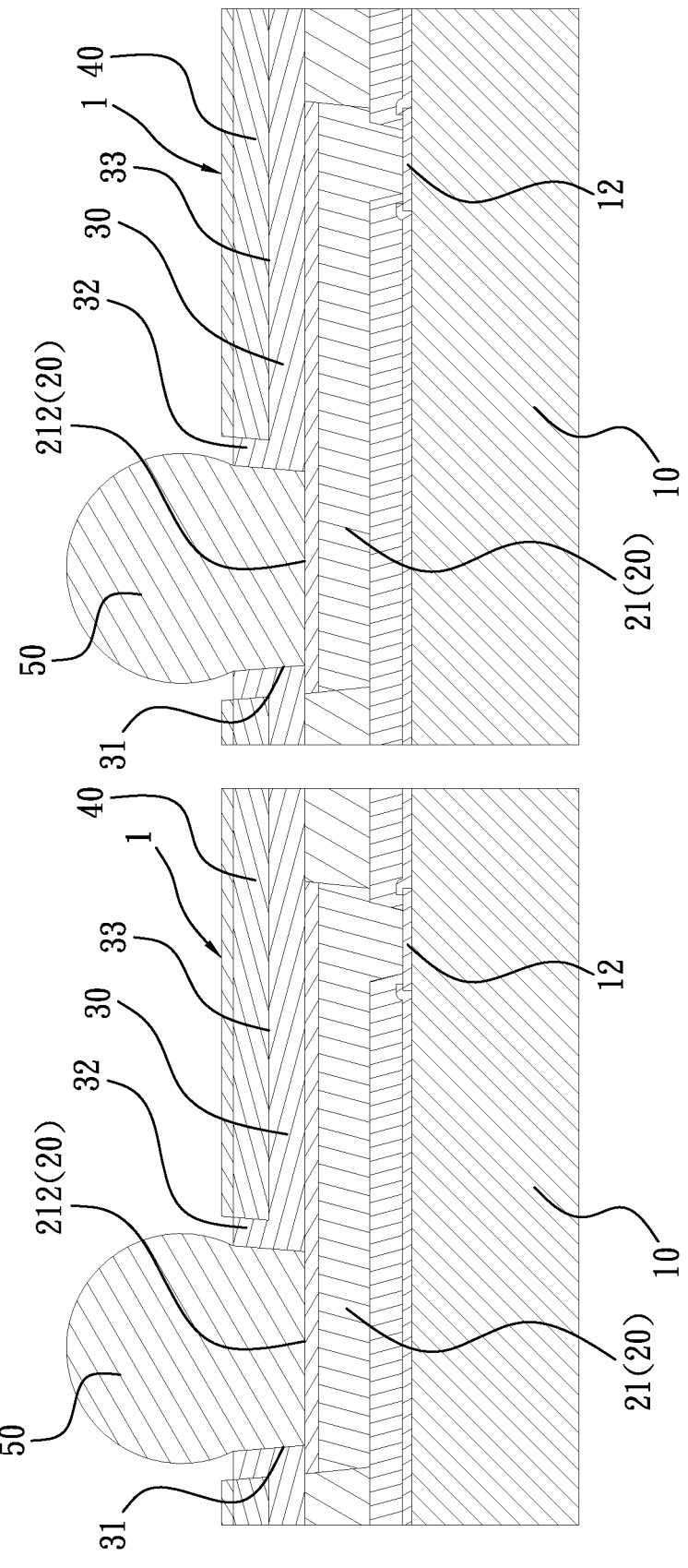
FIG. 2 is schematic drawing showing the chips in FIG. 1 after cutting according to the present invention.

Refer to FIG. 1-3, the first opening 31 of the insulating layer 30 is further provided with at least one solder ball 50, but not limited. Thus the pad 212 over the conductive circuit 21 can be electrically connected with the outside by the solder ball 50. The solder ball 50 is isolated and electrically insulated from the EMI shielding layer 40 by the peripheral wall 32 of the insulating layer 30.

Refer to FIG. 3, at least one outer protective layer 60, but not limited, is disposed on a surface 41 of the EMI shielding layer 40 for more protection of products. The outer protective layer 60 is made of metal such as nickel (Ni) or gold (Au), but not limited. The above metal such as nickel (Ni) or gold (Au) enhances heat dissipation.

Figure 5:
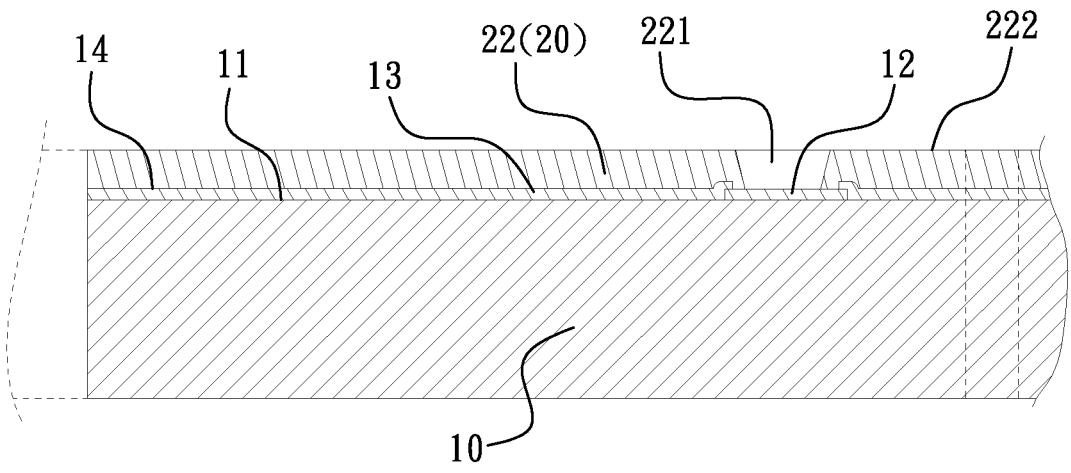
FIG. 5 is a schematic drawing showing a first dielectric layer arranged at the chip in FIG. 4 according to the present invention.
Figure 6:
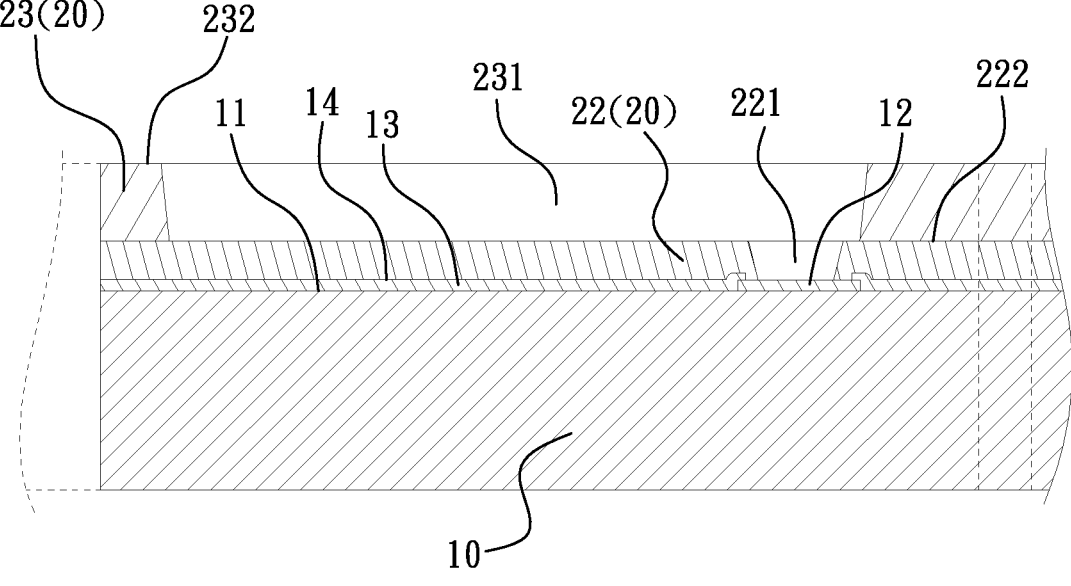
FIG. 6 is a schematic drawing showing a second dielectric layer disposed over the first dielectric layer in FIG. 5 according to the present invention.

Refer to FIG. 8, the RDL layer 20 further includes at least one first dielectric layer 22 and at least one second dielectric layer 23, but not limited. The first dielectric layer 22 is covering and disposed on the surface 14 of the chip protective layer 13 of the chip 10 and at least one first groove 221 is formed on the first dielectric layer 22 for allowing the die pad 12 to be exposed, as shown in FIG. 5. The second dielectric layer 23 is covering and arranged at a surface 222 of the first dielectric layer 22 and provided with at least one second groove 231 which is communicating with the first groove 221 of the first dielectric layer 22, as shown in FIG. 6. The conductive circuit 21 (as shown in FIG. 8) is formed by a metal paste 21a filled into the first groove 221 and the second groove 231 smoothly and fully (aa shown in FIG. 7). Thereby the die pad 12 is electrically connected with the conductive circuit 21. The problems of the chip products available now including larger thickness of the conductive circuit and complicated manufacturing processes can be solved by design of the RDL 20.

Figure 9:
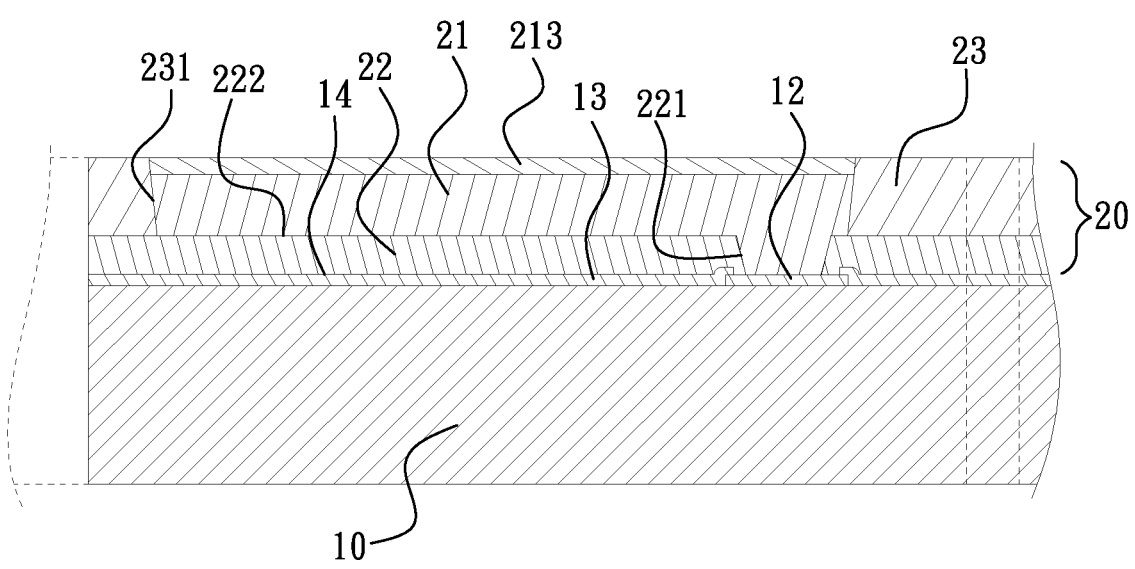
FIG. 9 is a schematic drawing showing a projecting block arranged at the conductive circuit in FIG. 8 according to the present invention.

Refer to FIG. 9, the conductive circuit 21 further includes a projecting block 213 thereover for protection or electrical conduction of the conductive circuit 21, but not limited. The projecting block 213 is made of metal such as nickel (Ni) or gold (Au) but not limited.

Refer to FIG. 1, FIG. 2, FIG. 4-8, and FIG. 10-12, a method of manufacturing the chip package 1 according to the present invention includes the following steps.

Figure 4:
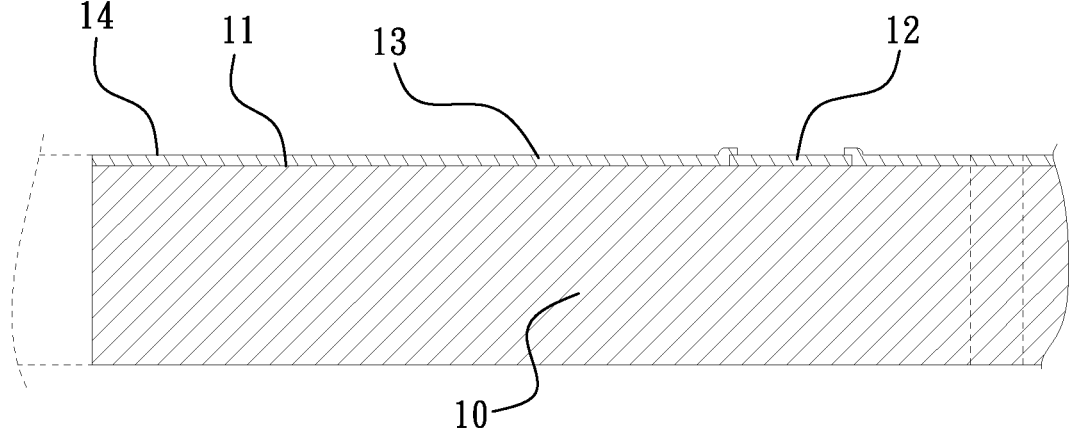
FIG. 4 is a sectional view of a chip according to the present invention.

Step S1: providing a wafer 2 on which a plurality of chips 10 is disposed to form an array (as shown in FIG. 1), Each of the chips 10 includes a surface 11 on which at least one die pad 12 and at least one chip protective layer 13 are disposed, as shown in FIG. 4. As shown in FIG. 1, a cut groove 2a is formed between the two adjacent chips 10 of the wafer 2 for separating the chips 10, as shown in FIG. 1.

Step S2: covering a surface 14 of the chip protective layer 13 of the chip 10 with a redistribution layer (RDL) 20 and the RDL 20 being provided with at least one conductive circuit 21 which is electrically connected with the die pad 12 of the chip 10 (as shown in FIG. 8). The conductive circuit 21 is provided with at least one pad 212 which is exposed on a surface 201 of the RDL 20 for electrically connected with the outside, as shown in FIG. 10.

Figure 7:
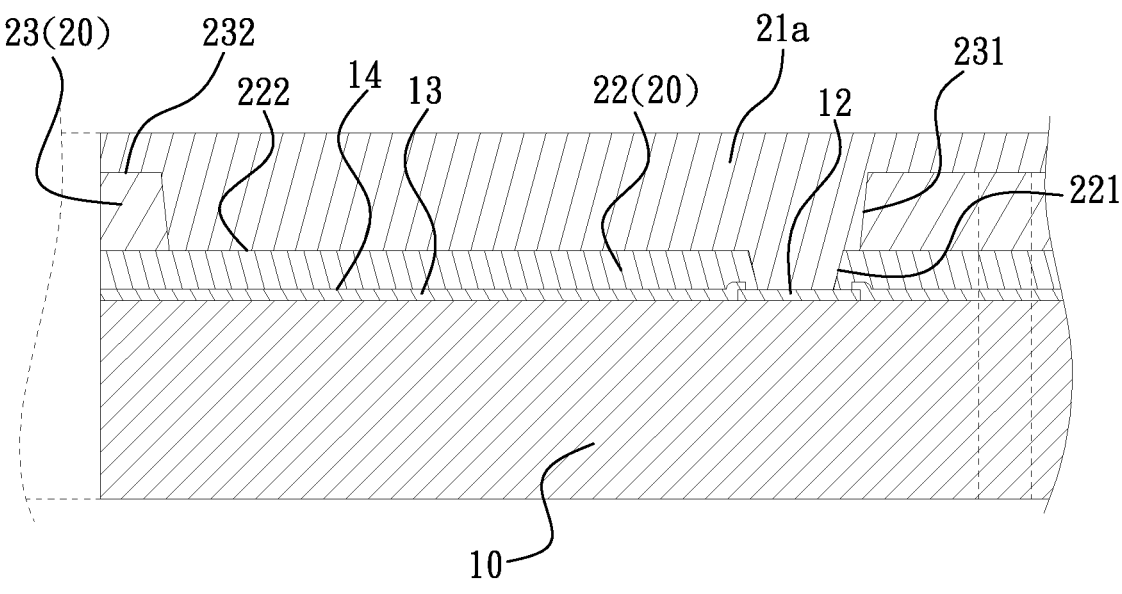
FIG. 7 is a schematic drawing showing a first groove and a second groove in FIG. 6 filled with metal paste according to the present invention.

As shown in FIG. 5, in the step S2, first the surface 14 of the chip protective layer 13 of the chip 10 is covered with at least one first dielectric layer 22 and at least one first groove 221 is formed on the first dielectric layer 22 so that the die pad 12 can be exposed by the first groove 22. A surface 222 of the first dielectric layer 22 is covered with at least one second dielectric layer 23, as shown in FIG. 6. At least one second groove 231 is formed on the second dielectric layer 23 and communicating with the first groove 221 of the first dielectric layer 22, as shown in FIG. 6. Then a metal paste 21a is filled into the first groove 221 and the second groove 231 while a level of the metal paste 21a is higher than a surface 232 of the second dielectric layer 23, as shown in FIG. 7. The metal paste 21a with the level higher than the surface 232 of the second dielectric layer 23 is ground to expose the surface 232 of the second dielectric layer 23 and a surface of the metal paste 21a is at the same level as the surface 232 of the second dielectric layer 23 to form the conductive circuit 21, as shown in FIG. 8.

The conductive circuit 21, the first dielectric layer 22, and the second dielectric layer 23 all together form the RDL 20.

Step S3: covering a surface 201 of the RDL 20 with an insulating layer 30 completely, as shown in FIG. 10, and the insulating layer 30 is provided with at least one first opening 31 for allowing the pad 212 of the conductive circuit 21 to be exposed by the first opening 31.

Step S4: forming a peripheral wall 32 around the first opening 31 of the insulating layer 30 for enclosing the first opening 31 and forming a flat portion 33 around the peripheral wall 32 of the insulating layer 30, as shown in FIG. 10. A level of the flat portion 33 is lower than a level of the peripheral wall 32.

Step S5: covering the flat portion 33 of the insulating layer 30 with an electromagnetic interference (EMI) shielding layer 40, as shown in FIG. 12. The EMI shielding layer 40 is made of metal. The EMI shielding layer 40 is isolated and electrically insulated from the pad 212 by the peripheral wall 32 of the insulating layer 30.

Figure 11:
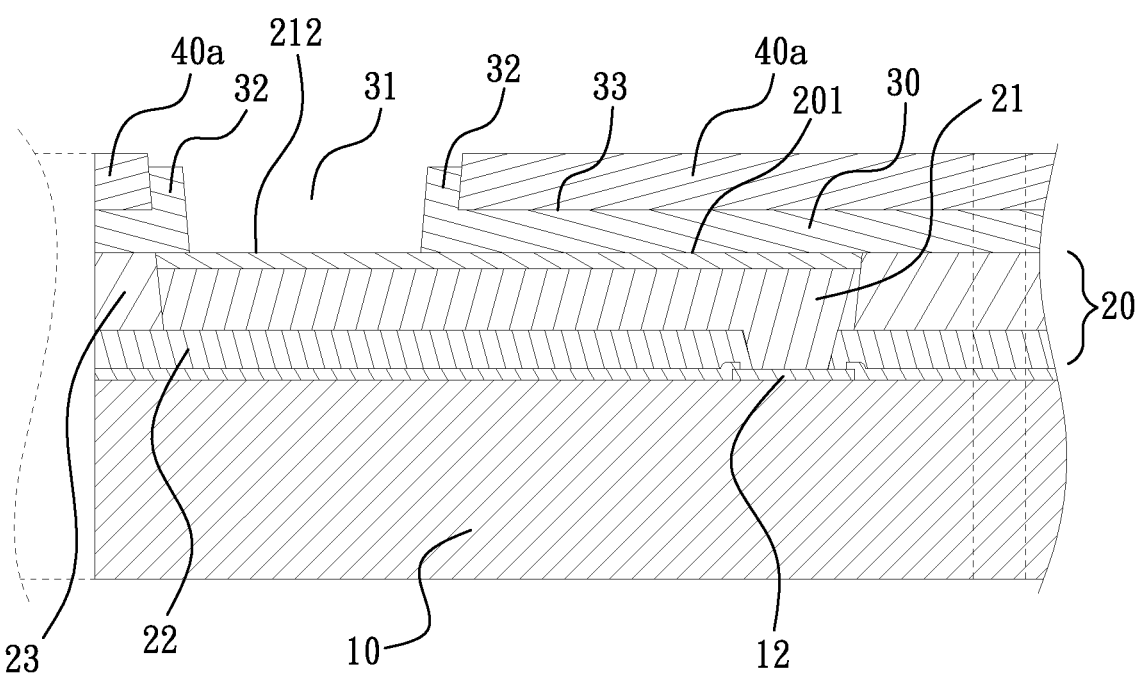
FIG. 11 is a schematic drawing showing a flat portion of an insulating layer in FIG. 10 filled with metal paste according to the present invention.

As shown in FIG. 11, in the step S5, first the flat portion 33 of the of the insulating layer 30 is fully filled with a metal paste 40a and a level of the metal paste 40a is higher than a level of the peripheral wall 32. The metal paste 40a with the level higher than the peripheral wall 32 is ground until a horizontal surface of the peripheral wall 32 is exposed. Thus a surface of the metal paste 40a is flush with the horizontal surface of the peripheral wall 32 to form the EMI shielding layer 40, as shown in FIG. 12.

Step S6: cutting along the cut grooves 2a of the wafer 2 for separating the chips 10 on the wafer 2, as shown in FIG. 1, to get a plurality of chip packages 1, as shown in FIG. 2.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A chip package with at least one electromagnetic interference (EMI) shielding layer comprising:
a chip provided with a surface on which at least one die pad and at least one chip protective layer are disposed; wherein the chip is formed by cutting a wafer;
a redistribution layer (RDL) arranged at a surface of the at least one chip protective layer of the chip and provided with at least one conductive circuit which is electrically connected with the at least one die pad of the chip; the at least one conductive circuit is provided with at least one pad which is exposed on a surface of the RDL for electrically connected with outside;
an insulating layer covering and disposed on the surface of the RDL completely and provided with at least one first opening for allowing the at least one pad of the conductive circuit to be exposed; wherein a peripheral wall is formed around the at least one first opening of the insulating layer for enclosing the at least one first opening and a flat portion is disposed around the peripheral wall; wherein a level of the flat portion is lower than a level of the peripheral wall; and
an EMI shielding layer made of metal and covering the flat portion of the insulating layer for preventing the at least one conductive circuit and the chip from an electromagnetic interference;

wherein the EMI shielding layer is isolated and electrically insulated from the at least one pad by the peripheral wall of the insulating layer.

2. The chip package as claimed in claim 1, wherein the EMI shielding layer is made of silver (Ag) adhesive.

3. The chip package as claimed in claim 1, wherein a level of the EMI shielding layer is not higher than a level of the peripheral wall of the insulating layer.

4. The chip package as claimed in claim 1, wherein the at least one first opening of the insulating layer is further provided with at least one solder ball so that the at least one pad of the conductive circuit is able to be electrically connected with the outside by the at least one solder ball; wherein the at least one solder ball is isolated and electrically insulated from the EMI shielding layer by the peripheral wall of the insulating layer.

5. The chip package as claimed in claim 1, wherein a surface of the EMI shielding layer is further provided with at least one outer protective layer.

6. The chip package as claimed in claim 1, wherein the at least one outer protective layer is made of metal including nickel (Ni) and gold (Au).

7. The chip package as claimed in claim 1, wherein the RDL further includes at least one first dielectric layer and at least one second dielectric layer; wherein the at least one first dielectric layer is covering a surface of the at least one chip protective layer of the chip and provided with at least one first groove for allowing the at least one die pad to be exposed by the at least one first groove; wherein the at least one second dielectric layer is covering a surface of the at least one first dielectric layer and provided with at least one second groove which is communicating with the at least one first groove of the at least one first dielectric layer; wherein the at least one conductive circuit is further formed by a metal paste being filled into the at least one first groove and the at least one second groove smoothly and fully; thereby the at least one die pad is electrically connected with the at least one conductive circuit.

8. The chip package as claimed in claim 1, wherein the at least one conductive circuit is made of silver (Ag) adhesive.

9. The chip package as claimed in claim 1, wherein the at least one conductive circuit further includes a projecting block which is made of metal including nickel (Ni) and gold (Au).

10. A method of manufacturing a chip package with at least one electromagnetic interference (EMI) shielding layer comprising the steps of:
Step S1: providing a wafer on which a plurality of chips is disposed to form an array and each of the plurality of chips includes a surface on which at least one die pad and at least one chip protective layer are disposed; wherein a cut groove is formed between two adjacent chips of the wafer for separating the plurality of chips;
Step S2: covering a surface of the at least one chip protective layer of the chip with a redistribution layer (RDL) and the RDL having at least one conductive circuit which is electrically connected with the at least one die pad of the chip while the at least one conductive circuit is provided with at least one pad which is exposed on a surface of the RDL for electrically connected with outside;
Step S3: covering a surface of the RDL with an insulating layer completely and the insulating layer is provided with at least one first opening for allowing the at least one pad of the at least one conductive circuit to be exposed by the at least one first opening;

Step S4: forming a peripheral wall around the at least one first opening of the insulating layer for enclosing the at least one first opening and forming a flat portion around the peripheral wall of the insulating layer; wherein a level of the flat portion is lower than a level of the peripheral wall;

Step S5: covering the flat portion of the insulating layer with an electromagnetic interference (EMI) shielding layer and the EMI shielding layer is made of metal; wherein the EMI shielding layer is isolated and electrically insulated from the at least one pad by the peripheral wall of the insulating layer; and Step S6: cutting along the cut groove of the wafer for separating the plurality of chips on the wafer to form a plurality of chip packages.

11. The method as claimed in claim 10, wherein the surface of the at least one chip protective layer of the chip is covered with at least one first dielectric layer and at least one first groove is formed on the at least one first dielectric layer so that the at least one die pad is exposed by the at least one first groove; wherein a surface of the at least one first dielectric layer is covered with at least one second dielectric layer and at least one second groove is formed on the at least one second dielectric layer while the at least one second groove is communicating with the at least one first groove of the at least one first dielectric layer; wherein a metal paste is filled into the at least one first groove and the at least one second groove and a level of the metal paste is higher than a surface of the at least one second dielectric layer; wherein the metal paste with the level higher than a surface of the at least one second dielectric layer is ground to expose the surface of the at least one second dielectric layer and thus a surface of the metal paste is at the same level as the surface of the at least one second dielectric layer to form the at least one conductive circuit; wherein the at least one conductive circuit, the at least one first dielectric layer, and the at least one second dielectric layer form the RDL.

12. The method as claimed in claim 10, wherein in the step S5, first the flat portion of the of the insulating layer is fully filled with a metal paste and a level of the metal paste is higher than a level of the peripheral wall; wherein the metal paste with the level higher than the peripheral wall is ground to expose a horizontal surface of the peripheral wall; thereby a horizontal surface of the metal paste is flush with the horizontal surface of the peripheral wall to form the EMI shielding layer.

*    *    *    *    *